United States Patent [19]

Sakakibara

[11] Patent Number: 5,635,730

[45] Date of Patent: Jun. 3, 1997

[54] SUPERCONDUCTING OXIDE THIN FILM DEVICE

[75] Inventor: Nobuyoshi Sakakibara, Kariya, Japan

[73] Assignee: Advanced Mobile Telecommunication Technology Inc., Nisshin, Japan

[21] Appl. No.: 467,122

[22] Filed: Jun. 6, 1995

[30] Foreign Application Priority Data

Mar. 22, 1995 [JP] Japan .................... 7-062252

[51] Int. Cl.$^6$ .................... H01L 29/06; H01L 39/22
[52] U.S. Cl. .................... 257/34; 257/35; 505/237; 505/238; 505/239
[58] Field of Search ............... 257/34, 35; 505/237–239

[56] References Cited

U.S. PATENT DOCUMENTS 4,797,593  1/1989  Saito et al. .................... 313/346 R

FOREIGN PATENT DOCUMENTS

| 9220078 | 11/1992 | WIPO . |
| 9220092 | 11/1992 | WIPO . |
| 9402862 | 2/1994  | WIPO . |
| 9405022 | 3/1994  | WIPO . |
| 9414201 | 6/1994  | WIPO . |
| 9428592 | 12/1994 | WIPO . |
| 9428627 | 12/1994 | WIPO . |

OTHER PUBLICATIONS

Hsieh et al., "Microstructure of epitaxial YBaCuO thin films grown on LaAlO3 (001)," Appl. Phys. Lett., vol. 57, No. 21, 19 Nov., 1990, pp. 2268–2270.

Muller et al., "Critical Phenomena near structure phase transistions studied by EPR," Ferroelectrics, vol. 7, 1974, pp. 17–21.

Wiener–Avnear et al., "In situ laser deposition of YBaCuO high Tc superconducting thin films with SrTiO3 underlayers," Appl. Phys. Lett., vol. 56, No. 18, 30 Apr. 1990, pp. 1802–1804.

Primary Examiner—Sara W. Crane
Attorney, Agent, or Firm—Cushman, Darby & Cushman IP Group of Pillsbury Madison & Sutro LLP

[57] ABSTRACT

A superconducting oxide thin film device is composed of a $LaAlO_3$ substrate and a YBCO thin film with a $BaCeO_3$ buffer layer disposed between the two. The adhesion between the film and the substrate is increased by the presence of the buffer layer. The buffer layer also inhibits peeling of the film from the substrate and diffusion of Ba from the film into the substrate.

18 Claims, 5 Drawing Sheets

201,203  202  212  204  213

SUPERCONDUCTING OXIDE THIN FILM DEVICE

CROSS-REFERENCE TO RELATED APPLICATION

This application is related to and claims priority under 35 U.S.C. §119 from Japanese Patent Application No. Hei. 7-62252, incorporated herein by reference.

BACKGROUND OF THE INVENTION

1. Field of the Invention

The present invention relates to superconducting oxide thin film device having a superconducting oxide thin film formed on a dielectric substrate.

2. Background of the Invention

A yttrium-based superconducting oxide thin film (hereinafter referred to as a "YBCO thin film") which has a high critical current density and a high critical temperature, is considered useful as a material for making Josephson junction devices and high-frequency passive devices.

Also, $LaAlO_3$ generally has a high relative dielectric constant coupled with a low dielectric loss tangent, and this has heretofore provided satisfactory results when used as a high-frequency dielectric material.

Therefore, it is possible that a device composed of a YBCO thin film and a monocrystalline $LaAlO_3$ substrate may have significantly improved device characteristics at an operating frequency of several gigahertz.

Although when a YBCO thin film is directly formed on a monocrystalline $LaAlO_3$ substrate, the YBCO thin film does grow heteroepitaxially to give a monocrystalline film thereon, this technique is problematic in that the adhesion between the film and the substrate is poor and Ba in the YBCO film diffuses into the substrate during the formation of the film on the substrate.

The poor adhesion between the substrate and the YBCO thin film causes peeling of the YBCO thin film from the substrate during production of the device. In addition, it lowers the reliability of the device produced.

The diffusion of Ba into the substrate results in the deficiency of Ba elements in the vicinity of the interface of the YBCO film, thereby degrading the performance characteristics of the device due to crystal defects in the film (for example, to lower the critical temperature of the device or to lower the critical current density thereof), which, in a worst-case scenario, impairs the superconductive condition of the device due to the variation in the crystal structure of the film formed on the substrate.

SUMMARY OF THE INVENTION

The present invention has been made in consideration of the above-mentioned problems, and one of its objectives is to improve the adhesion between a superconducting Ba-containing oxide thin film and a dielectric substrate thereby preventing the Ba elements in the superconducting oxide thin film from diffusing into the dielectric substrate.

In order to attain the above-mentioned objective, the present invention provides a superconducting oxide thin film device composed of a dielectric substrate and a superconducting Ba-containing oxide thin film formed on the substrate, where the device has a buffer layer comprising Ba as one element constituting the buffer layer between the substrate and the film.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE INVENTION

The dielectric substrate in the device of the present invention may preferably be a monocrystalline $LaAlO_3$ substrate, and the superconducting oxide thin film therein may preferably be a superconducting yttrium-based oxide thin film.

The buffer layer has a crystal structure, where the crystals grow epitaxially on the dielectric substrate and function as crystal seeds for the epitaxial growth of the superconducting oxide thin film. This buffer layer may be composed of constitutive elements of Ba, Ce and O. For example, this layer may be a $BaCeO_3$ buffer layer.

Since the superconducting oxide thin film device of the present invention has the Ba-containing buffer layer between the dielectric substrate and the superconducting Ba-containing oxide thin film, the adhesion between the dielectric substrate and the superconducting oxide thin film is high and therefore the superconducting oxide thin film does not peel off of the dielectric substrate. In addition, since the buffer layer contains Ba, the diffusion of Ba from the superconducting Ba-containing oxide thin film is inhibited and therefore the quality of the superconducting oxide thin film is improved.

Figure 1:
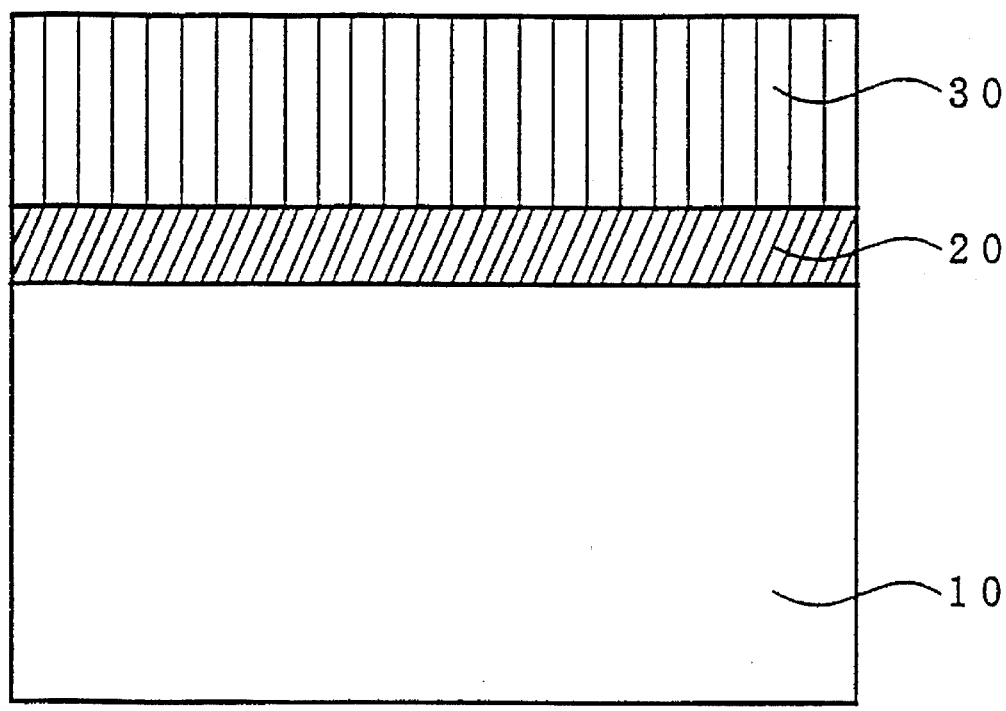
FIG. 1 is cross-sectional view showing one embodiment of the present invention in which a $BaCeO_3$ buffer layer 20 exists between an $LaAlO_3$ substrate 10 and a YBCO thin film 30.

Examples of the present invention are described in detail below with reference to the drawings attached hereto. FIG. 1 is cross-sectional view showing one embodiment of the present invention which has a YBCO thin film formed on an $LaAlO_3$ substrate.

In FIG. 1, 10 is an $LaAlO_3$ substrate, 20 is a $BaCeO_3$ buffer layer, and 30 is a YBCO thin film. The thickness of the $BaCeO_3$ buffer layer is about 50 nm. If it is thicker, the $BaCeO_3$ buffer layer can sufficiently absorb the lattice strain. If it is too thick, however, the layer has a negative influence on the dielectric characteristics of the underlying $LaAlO_3$ substrate. Therefore, it is preferred that the layer has a thickness of from 25 nm to 100 nm.

Figure 2A:
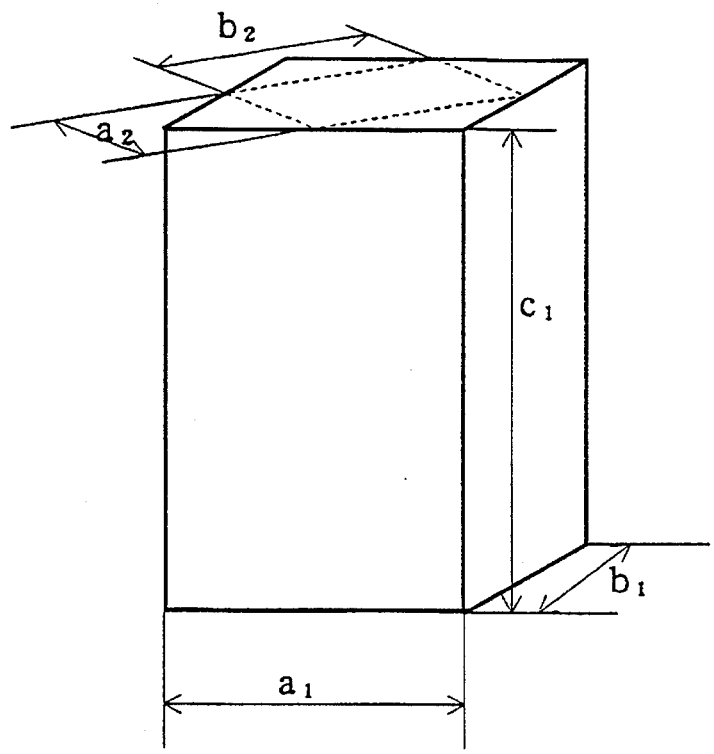
FIG. 2A is a perspective outline view showing the unit cell of a crystal of $LaAlO_3$.
Figure 2B:
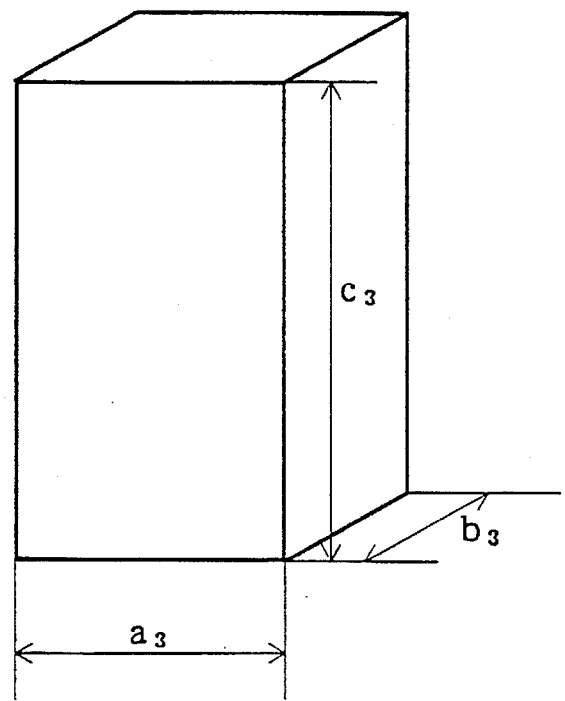
FIG. 2B is a perspective outline view showing the unit cell of a crystal of YBCO.

FIG. 2A is a perspective outline view showing the unit cell of a crystal of $LaAlO_3$; and FIG. 2B is a perspective outline view showing the unit cell of a crystal of YBCO.

The crystal of $LaAlO_3$ is tetragonal (pseudo-cubic), in which $a_1=b_1=0.5364$ nm and $c_1=1.311$ nm. It is considered that the (001) plane of the crystal has a square lattice with $a_2=b_2=a_1/\sqrt{2}=0.3792$ nm. On the other hand, the crystal of YBCO is rhombic, in which $a_3=0.3820$ nm, $b_3=0.3886$ nm and $c_3=1.169$ nm. Since the value of $a_2$ (=$b_2$) is near to that of $a_3$ and $b_3$ (that is, the percentage of lattice mismatch is less than 1%), YBCO can grow epitaxially on $LaAlO_3$.

Figure 3:
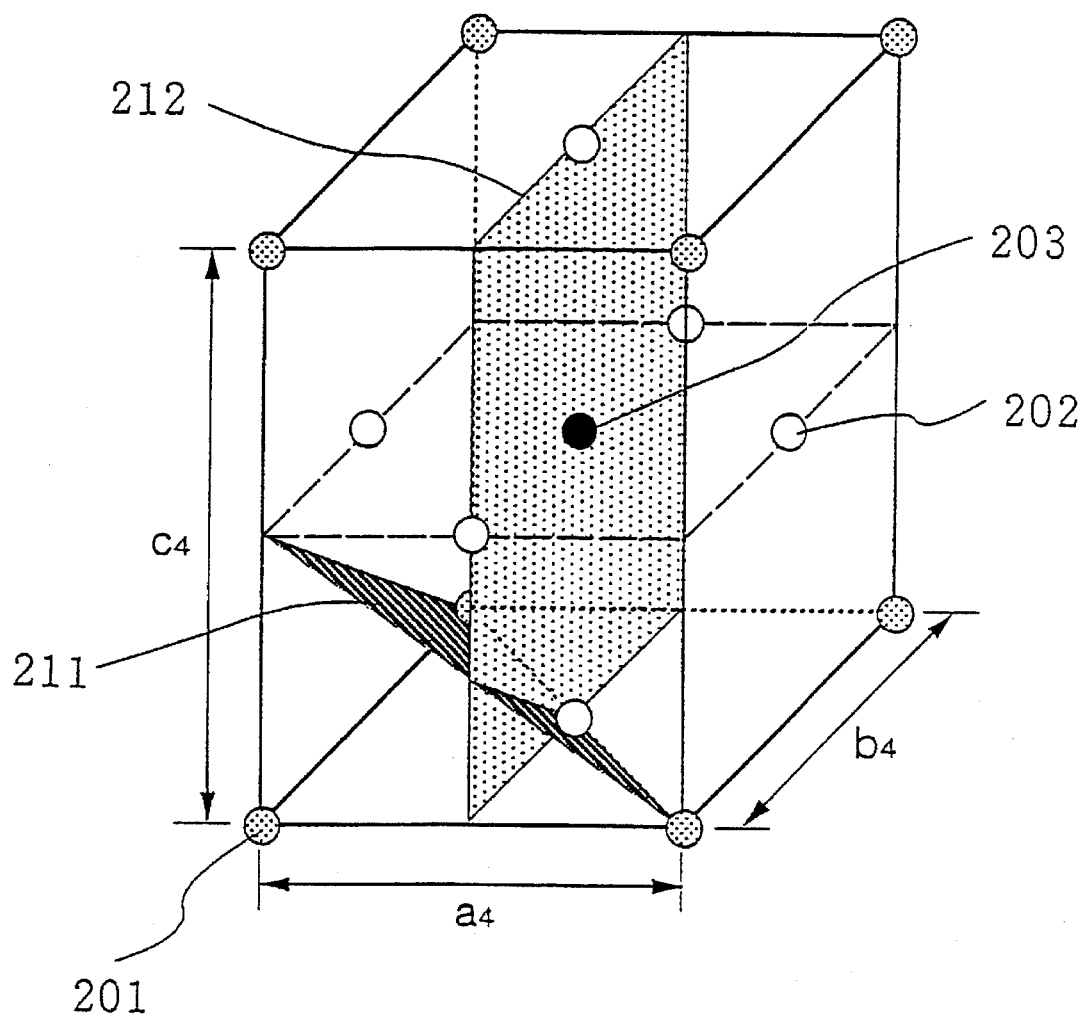
FIG. 3 is a perspective outline view showing the unit cell of a crystal of $BaCeO_3$.

FIG. 3 is a perspective outline view showing the unit cell of a crystal of $BaCeO_3$ which is used as the buffer layer in the present invention. The crystal of $BaCeO_3$ is tetragonal, in which $a_4=b_4=0.6212$ nm and $c_4=0.8804$ nm. In FIG. 3, reference numeral 201 denotes a Ba atom, reference numeral 202 denotes an oxygen atom, reference numeral 203 denotes a Ce atom, reference numeral 211 denotes the crystal (112) plane, and reference numeral 212 denotes the crystal (200) plane. These two planes (112) and (200) are formed in the interface between the $LaAlO_3$ and YBCO layers.

Figure 4:
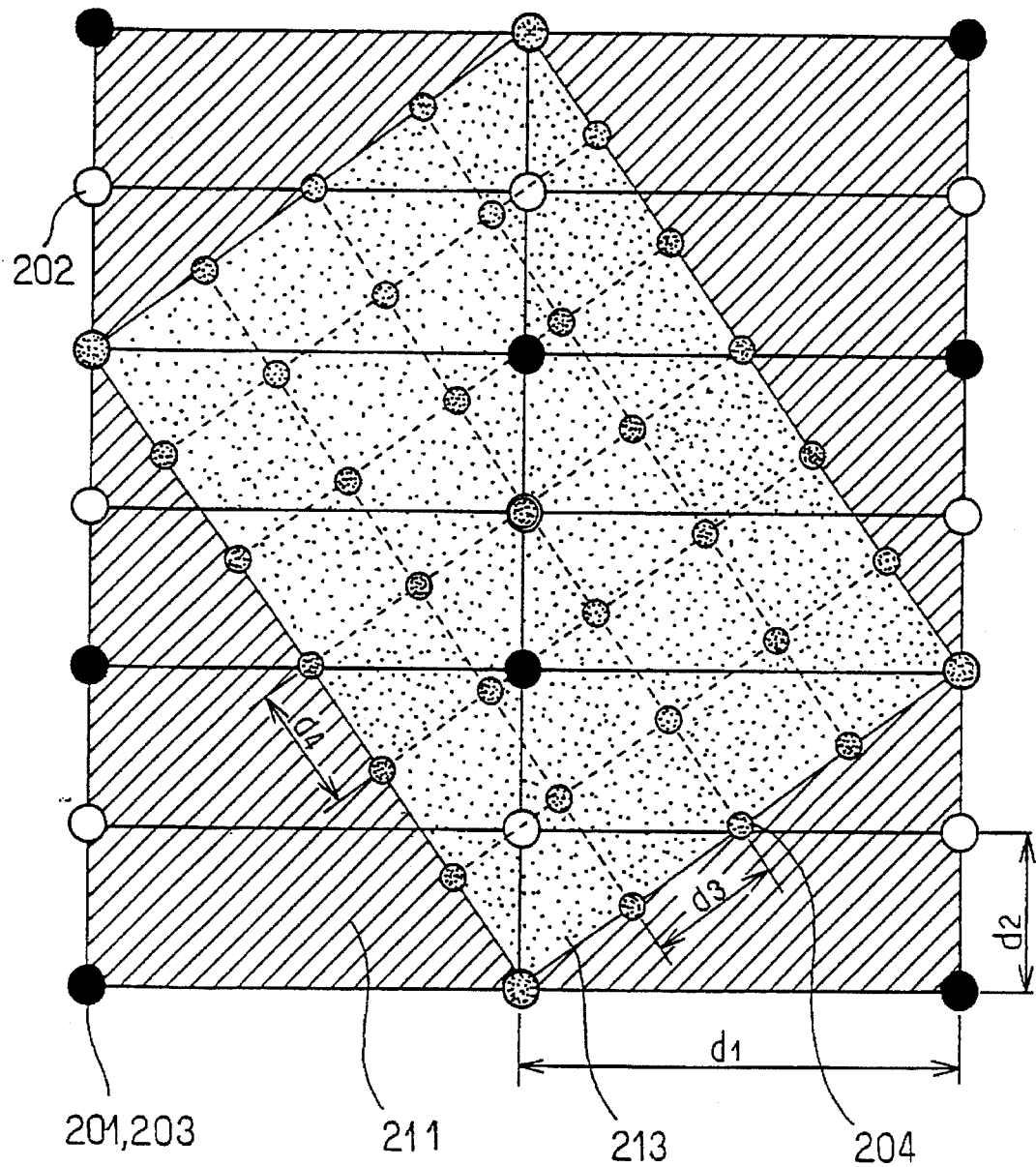
FIG. 4 is a plan view showing the relative positions in the atomic arrangement in the interface between the (112) plane of $BaCeO_3$ and the (001) plane of $LaAlO_3$ or YBCO.

FIG. 4 is a graphic plan view showing the relative positions in the atomic arrangement in the interface between the (112) plane of $BaCeO_3$ and the (001) plane of $LaAlO_3$ or YBCO.

In FIG. 4, 211 is the (112) plane of $BaCeO_3$, in which Ba atoms 201, oxygen atoms 202 and Ce atoms 203 exist. $d_1$ and $d_2$ each indicate the dimension of the basic lattice of the (112) plane of $BaCeO_3$, and $d_1=1.2437$ nm and $d_2=0.4393$ nm.

On the other hand, 213 is the (001) plane of $LaAlO_3$ or YBCO, in which 204 is the constitutive atom; that is, a La, Al, or O atom constituting the $LaAlO_3$ substrate, or Y or another element constituting the YBCO film. $d_3$ and $d_4$ each indicate the dimension of the basic lattice, which are the nearest to the lattice constants of $LaAlO_3$ or YBCO, and $d_3=0.3807$ nm and $d_4=0.3588$ nm. The value of $d_4$ corresponds to a percentage of lattice mismatch of about 7%, as compared with the lattice constant of YBCO, $b_3=0.3886$ nm, at which, however, the epitaxial growth of the crystal is possible.

Figure 5:
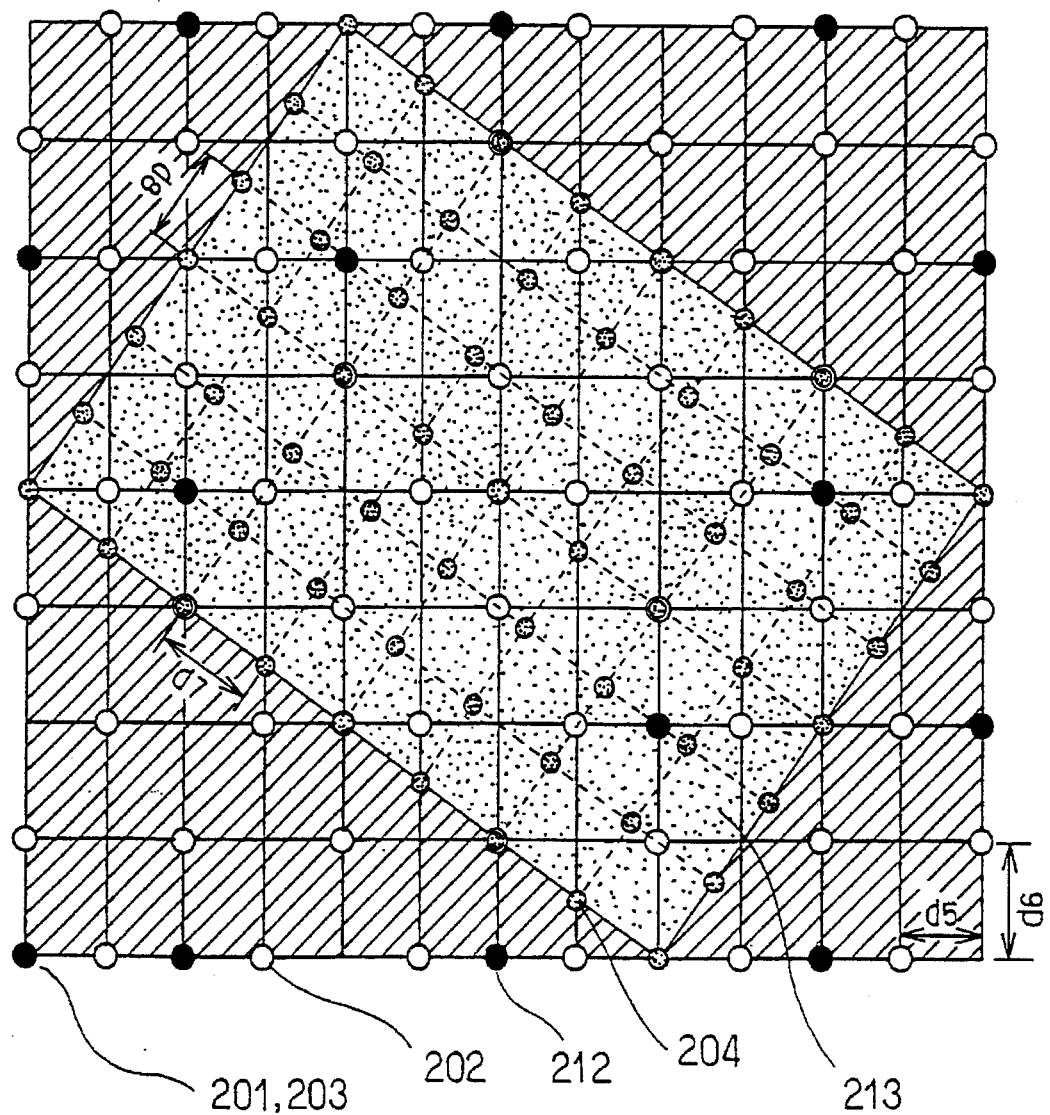
FIG. 5 is a plan view showing the relative positions in the atomic arrangement in the interface between the (200) plane of $BaCeO_3$ and the (001) plane of $LaAlO_3$ or YBCO.

FIG. 5 is a graphic plan view showing the relative positions in the atomic arrangement in the interface between the (200) plane of $BaCeO_3$ and the (001) plane of $LaAlO_3$ or YBCO.

In FIG. 5, 212 is the (200) plane of $BaCeO_3$, in which Ba atoms 201, oxygen atoms 202 and Ce atoms 203 exist. $d_5$ and $d_6$ indicate the dimensions of the basic lattice of the (200) plane of $BaCeO_3$, and $d_5=0.3106$ nm and $d_6=0.4402$ nm.

On the other hand, 213 is the (001) plane of $LaAlO_3$ or YBCO, in which 204 is the constitutive atom; that is, a La, Al, or O atom constituting the $LaAlO_3$ substrate, or Y or another element constituting the YBCO film. $d_7$ and $d_8$ indicate the dimensions of the basic lattice, which are the nearest to the lattice constants of $LaAlO_3$ or YBCO, and $d_7=0.3807$ nm and $d_8=0.3587$ nm. The value of $d_8$ corresponds to a percentage of lattice mismatch of about 7% (like that of $d_4$), as compared with the lattice constant of YBCO, $b_3=0.3886$ nm, at which, however, the epitaxial growth of the crystal is possible.

Therefore, since the lattice mismatch between the basic lattice in the $BaCeO_3$ buffer layer 20 and the basic lattice in the $LaAlO_3$ substrate and also the lattice mismatch between the basic lattice in the $BaCeO_3$ buffer layer and the basic lattice in the YBCO thin film are both not larger than 10%, it is possible to make the $BaCeO_3$ buffer layer 20 epitaxially grow on the $LaAlO_3$ substrate and to make the YBCO thin film also epitaxially grow on the $BaCeO_3$ buffer layer 20.

Since the device including a YBCO thin film and a $LaAlO_3$ substrate according to this embodiment has the $BaCeO_3$ buffer layer 20 between the YBCO thin film 30 and the $LaAlO_3$ substrate 10, the surface wettability of the $BaCeO_3$ buffer layer 20 with respect to the film 30 is better than that of the substrate 10 and the YBCO crystals can grow sufficiently even in the in-plane direction of the film with the result that the surface homology of the YBCO thin film is improved.

The improvement in the surface homology of the YBCO thin film results in the improvement in the dimensional accuracy in the formation of the device by photolithography and the device formed thereby can sufficiently provide a current route in the superconducting material and sufficient current can be applied to the device.

In addition, since the adhesion between the $LaAlO_3$ substrate 10 and the YBCO thin film 20 is improved due to the $BaCeO_3$ buffer 20 layer provided therebetween, the YBCO thin film 30 does not peel away from the $LaAlO_3$ substrate 10 when fabricating the device, and therefore the reliability of the device is improved. Moreover, since the buffer layer 20 contains Ba, the diffusion of Ba from the YBCO thin film 30 to the substrate 10 is inhibited and the quality of the YBCO thin film thus formed is improved.

In the embodiment illustrated herein, $LaAlO_3$ is used as the material of the dielectric substrate, which, however, is not limitative. Any material can be employed as long as it accepts the epitaxial growth of the buffer layer and the superconducting oxide thin film can be grown thereon. The superconducting oxide thin film is not limited to only YBCO illustrated herein, but any other suitable material containing Ba as a constitutive element of the superconducting oxide thin film can be employed.

The buffer layer illustrated herein is made of $BaCeO_3$, which also is not limitative. Any material having Ba element as one constitutive element can be employed, including, for example, barium titanate ($BaTiO_3$), barium oxide (BaO) and the like.

While the invention has been described in detail and with reference to a specific embodiment thereof, it will be apparent to one skilled in the art that various changes and modifications can be made therein without departing from the spirit and scope thereof.

What is claimed is:

1. An oxide film device capable of superconductive operation, said device comprising:
   a dielectric substrate;
   a buffer layer disposed on said substrate, said buffer layer including Ba, Ce and O as constitutive elements; and
   an oxide film disposed on said buffer layer, said film being made of a material capable of superconductive operation, said material including Ba.

2. The oxide film device of claim 1, in which said buffer layer includes $BaCeO_3$.

3. The oxide film device of claim 1 wherein:
   said dielectric substrate is a monocrystalline substrate; and
   said buffer layer has a crystal structure epitaxially grown on said dielectric substrate which functions as a crystal seed structure for epitaxial growth of said oxide film.

4. The oxide film device of claim 4, wherein said buffer layer includes Ba, Ce and O.

5. The oxide film device of claim 4, in which said buffer layer includes $BaCeO_3$.

6. The oxide film device of claim 3 wherein:
   said dielectric substrate is a monocrystalline $LaAlO_3$ substrate; and
   said oxide film is a yttrium-based oxide film.

7. The oxide film device of claim 6, wherein said buffer layer includes Ba, Ce and O.

8. The oxide film device of claim 7, in which said buffer layer includes $BaCeO_3$.

9. The oxide film device of claim 1 wherein:

said dielectric substrate is a monocrystalline $LaAlO_3$ substrate;

said oxide film is a yttrium-based oxide film; and crystal planes are defined at an interface between said monocrystalline $LaAlO_3$ substrate and said $BaCeO_3$ buffer layer and at an interface between said buffer layer and said yttrium-based oxide film so that a shape of a (001) plane of said $LaAlO_3$ substrate is that of a face of a pseudo-cubic crystal, a shape of a (001) plane of said yttrium-based oxide film is that of a face of a rhombic crystal, and a shape of one of a (112) plane and a (200) plane of said buffer layer is that of a face of a tetragonal crystal.

10. The oxide film device of claim 1, wherein said oxide film is a superconducting oxide film.

11. An oxide film device comprising:

a dielectric substrate; and buffer means disposed on said dielectric substrate; and an oxide film disposed on said buffer layer, said film being made of a material capable of superconductive operation, said material including Ba, Ce and O;

wherein said buffer means is for forming an adhesive bond with said oxide film on a first side and with said dielectric substrate on a second side and for substantially preventing diffusion of said Ba atoms from said oxide film to said dielectric substrate.

12. The oxide film device of claim 11, in which said layer includes $BaCeO_3$.

13. The oxide film device of claim 11 wherein:

said dielectric substrate is a monocrystalline substrate; and said buffer means includes a layer which has a crystal structure epitaxially grown on said dielectric substrate which functions as a crystal seed structure for epitaxial growth of said oxide film.

14. The oxide film device of claim 13 wherein:

said dielectric substrate is a monocrystalline $LaAlO_3$ substrate; and said oxide film is a yttrium-based oxide film.

15. The oxide film device of claim 11 wherein:

said dielectric substrate is a monocrystalline $LaAlO_3$ substrate;

said oxide film is a yttrium-based oxide film; and crystal planes are defined at an interface between said monocrystalline $LaAlO_3$ substrate and said buffer means and at an interface between said buffer means and said yttrium-based oxide film so that a shape of a (001) plane of said $LaAlO_3$ substrate is that of a face of a pseudo-cubic crystal, a shape of a (001) plane of said yttrium-based oxide film is that of a face of a rhombic crystal, and a shape of one of a (112) plane and a (200) plane of said buffer means is that of a face of tetragonal crystal.

16. The oxide film device of claim 11, wherein said oxide film is a superconducting oxide film.

17. The oxide film device of claim 9, wherein said buffer layer includes $BaCeO_3$.

18. The oxide film device of claim 15, wherein said buffer means has a layer which includes $BaCeO_3$.

* * * * *